US010381545B2

(12) United States Patent
Yamagishi et al.

(10) Patent No.: US 10,381,545 B2
(45) Date of Patent: Aug. 13, 2019

(54) VIBRATION DEVICE AND TACTILE PRESENTATION DEVICE

(71) Applicant: Murata Manufacturing Co., Ltd., Nagaokakyo-shi, Kyoto-fu (JP)

(72) Inventors: Yuhei Yamagishi, Nagaokakyo (JP); Junichi Hashimoto, Nagaokakyo (JP); Kentaro Usui, Nagaokakyo (JP)

(73) Assignee: MURATA MANUFACTURING CO., LTD., Nagakakyo-Shi, Kyoto-Fu (JP)

( * ) Notice: Subject to any disclaimer, the term of this patent is extended or adjusted under 35 U.S.C. 154(b) by 60 days.

(21) Appl. No.: 15/890,425

(22) Filed: Feb. 7, 2018

(65) Prior Publication Data

US 2018/0175279 A1   Jun. 21, 2018

Related U.S. Application Data

(63) Continuation of application No. PCT/JP2016/078969, filed on Sep. 30, 2016.

(30) Foreign Application Priority Data

Oct. 2, 2015 (JP) .................. 2015-196612

(51) Int. Cl.
*H01L 41/09* (2006.01)
*B06B 1/06* (2006.01)
(Continued)

(52) U.S. Cl.
CPC ........ *H01L 41/0926* (2013.01); *B06B 1/0603* (2013.01); *B06B 1/0688* (2013.01);
(Continued)

(58) Field of Classification Search
CPC . H01L 41/0926; H01L 41/042; H01L 41/047; H01L 41/0986; B06B 1/0603; B06B 1/0688; G06F 3/016; G06F 3/0416; G06F 2203/04103
See application file for complete search history.

(56) References Cited

U.S. PATENT DOCUMENTS 9,332,353 B2   5/2016   Ando
9,363,607 B2   6/2016   Ando
(Continued)

FOREIGN PATENT DOCUMENTS

JP   H10-135531 A   5/1998
JP   2004-171512 A   6/2004
(Continued)

OTHER PUBLICATIONS

International Search Report issued in International Application No. PCT/JP2016/078969, dated Nov. 1, 2016.
(Continued)

*Primary Examiner* — Peter D McLoone
(74) *Attorney, Agent, or Firm* — Arent Fox LLP (57) ABSTRACT

A vibration device that includes a diaphragm having a perimeter; a film which expands and contracts in a planar direction by application of a voltage, and an electrode on each main surface thereof; and a wire extended from the electrode outside of the perimeter of the diaphragm. The diaphragm has a first region in a node of vibration and a second region in a position other than the node of vibration. The wire has a section extended from the second region toward the first region, or is extended from the first region outside of the perimeter of the diaphragm.

18 Claims, 10 Drawing Sheets

(51) Int. Cl.
*G06F 3/01* (2006.01)
*G06F 3/041* (2006.01)
*H01L 41/04* (2006.01)
*H01L 41/047* (2006.01)

(52) U.S. Cl.
CPC ............ *G06F 3/016* (2013.01); *G06F 3/0416* (2013.01); *H01L 41/042* (2013.01); *H01L 41/047* (2013.01); *H01L 41/0986* (2013.01); *G06F 2203/04103* (2013.01)

(56) References Cited

U.S. PATENT DOCUMENTS

| 9,921,654 B2 | 3/2018 | Hashimoto et al. |
| 2014/0079255 A1 | 3/2014 | Ando |
| 2015/0131822 A1 | 5/2015 | Ando |
| 2015/0131823 A1 | 5/2015 | Ando |
| 2016/0209926 A1 | 7/2016 | Hashimoto et al. |
| 2018/0130941 A1* | 5/2018 | Usui .................. G06F 3/041 |

FOREIGN PATENT DOCUMENTS

| JP | 2009-154111 A | 7/2009 |
| WO | WO 2012/157691 A1 | 11/2012 |
| WO | WO 2015/053247 A1 | 4/2015 |

OTHER PUBLICATIONS

Written Opinion of the International Searching Authority issued in International Application No. PCT/JP2016/078969, dated Nov. 1, 2016.

\* cited by examiner

VIBRATION DEVICE AND TACTILE PRESENTATION DEVICE

CROSS REFERENCE TO RELATED APPLICATIONS

The present application is a continuation of International application No. PCT/JP2016/078969, filed Sep. 30, 2016, which claims priority to Japanese Patent Application No. 2015-196612, filed Oct. 2, 2015, the entire contents of each of which are incorporated herein by reference.

FIELD OF THE INVENTION

The present invention relates to a vibration device for generating vibration and a tactile presentation device including the vibration device.

BACKGROUND OF THE INVENTION

In recent years, there has been proposed a tactile presentation device that transmits vibrations to a user when the user touches a key on a touch panel type keyboard or the like, so as to give the user tactile feedback and makes the user feel that the key has been "pressed".

For example, Patent Document 1 proposes a tactile presentation device including a diaphragm and a piezoelectric film. The piezoelectric film is connected in a state where stress is generated in the diaphragm. The piezoelectric film is an example of a film that expands and contracts in a planar direction by application of a voltage. When the piezoelectric film expands and contracts, the diaphragm vibrates in a normal direction.

Patent Document 1: International Publication No. 2015/053247

SUMMARY OF THE INVENTION

In order to apply a voltage to the film that expands and contracts in the planar direction, it is conceivable to connect a lead wire to each of electrodes formed on both sides of the film. However, due to expansion and contraction of the film, connection failure such as peeling may occur in the connecting section.

Accordingly, it is an object of the present invention to provide a vibration device and a tactile presentation device that prevent the occurrence of connection failure due to expansion and contraction of a film.

A vibration device of the present invention includes a diaphragm having a perimeter; a film which expands and contracts in a planar direction by application of a voltage, and an electrode on each main surface thereof; and an extended wire extending from the electrode outside of the perimeter of the diaphragm. The diaphragm has a first region located in a node of vibration and a second region located in a position other than the node of vibration. The extended wire has a section extending from the second region toward the first region, or the extended wire extends from the first region outside of the perimeter of the diaphragm.

The diaphragm vibrates in the normal direction, and has a first region being a region located in a node of vibration and a second region being a region that vibrates. The extended wire has a section extending from the second region toward the first region, so that the extended wire is extended outside of the perimeter of the diaphragm from a section with less vibration than a section connected with the electrode. Alternatively, also when the extended wire is extended from the first region outside of the perimeter of the diaphragm, the extended wire is extended outside of the perimeter of the diaphragm from a portion with less vibration. Therefore, the vibration device of the present invention can prevent the occurrence of connection failure due to expansion and contraction of the film.

Note that the connecting section between the extended wire and the electrode is preferably a section where the film does not expand or contract. For example, in the connecting section between the film and the diaphragm, the end side of the film is a section where the film does not expand or contract. However, the end of the film is still in the second region where the diaphragm vibrates. Therefore, also in this case, the extended wire is extended toward the first region side which is the node of the vibration, and it is thus possible to prevent the occurrence of connection failure due to expansion and contraction of the film.

According to the present invention, the occurrence of connection failure due to expansion and contraction of the film can be prevented.

DETAILED DESCRIPTION OF THE INVENTION

Figure 1:
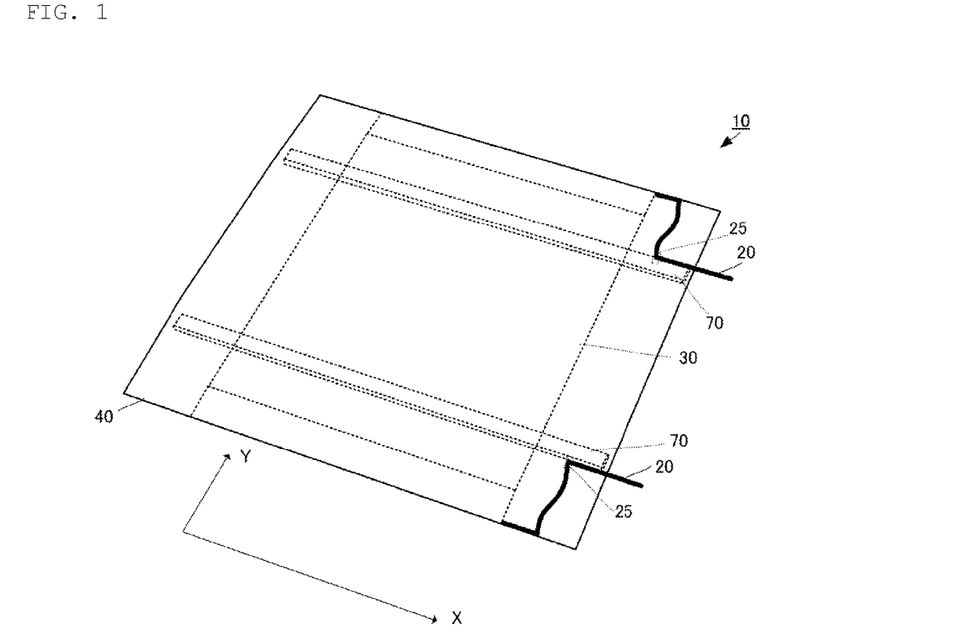
FIG. 1 is an external perspective view of a key input device.
Figure 2:
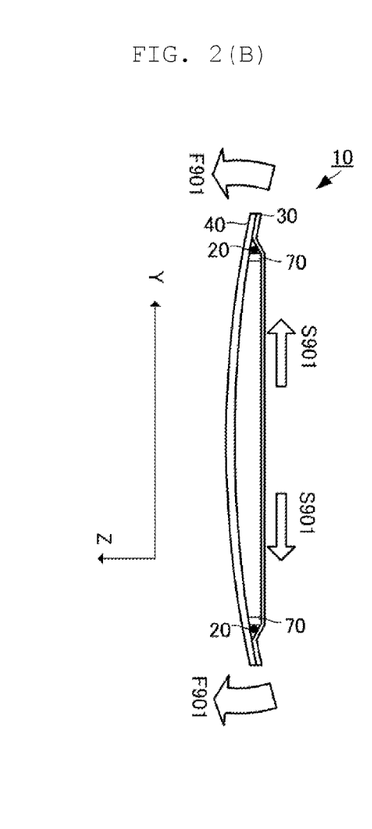
FIG. 2(A) is a side view of the key input device.
FIG. 2(B) is a front view thereof.
Figure 3:
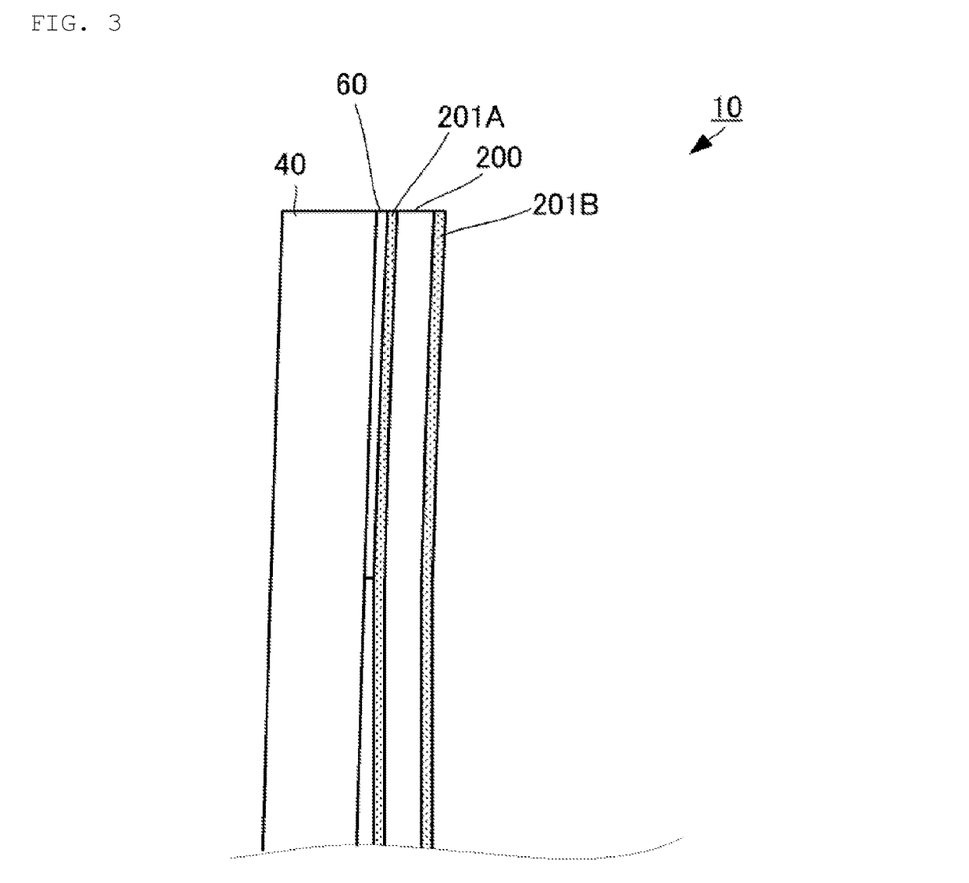
FIG. 3 is a partial enlarged side view of the key input device.
Figure 4:
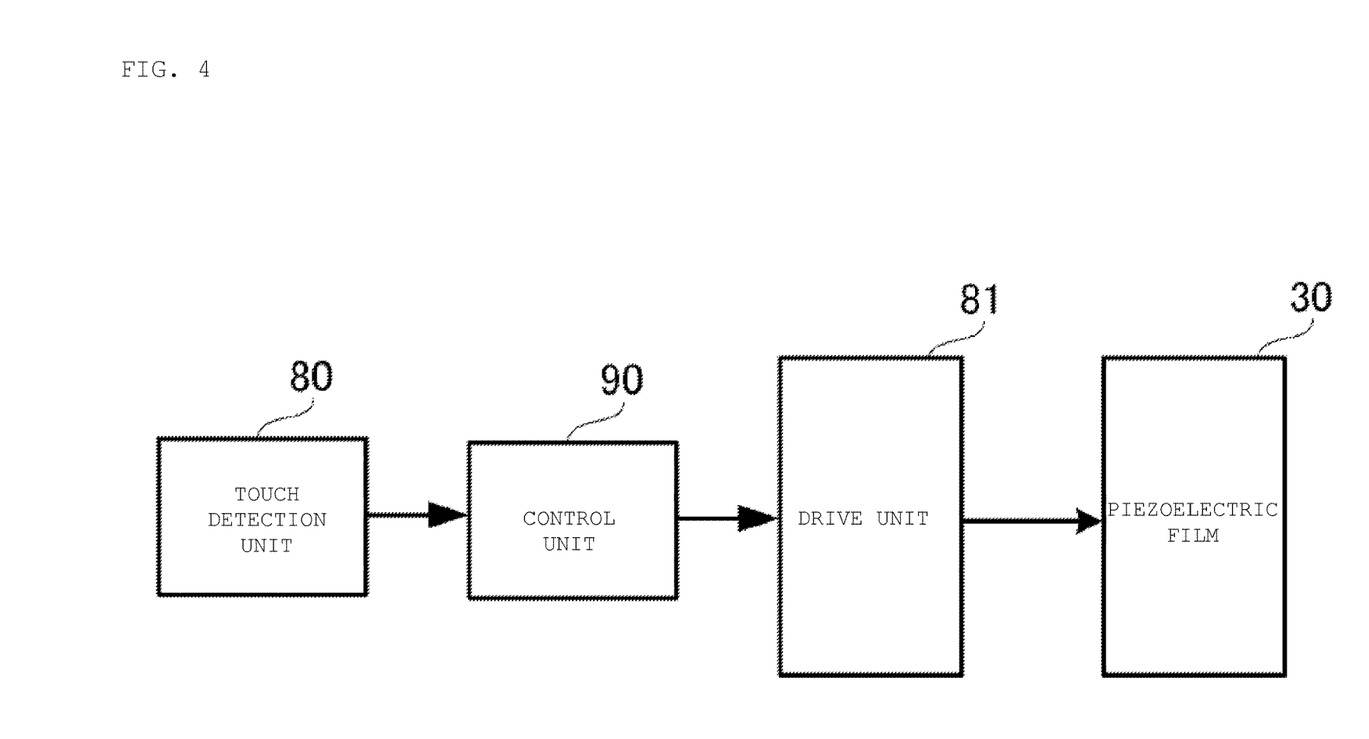
FIG. 4 is a block diagram showing a configuration of the key input device.

FIG. 1 is an external perspective view of a key input device 10 showing an example of a vibration device of the present invention. FIG. 2(A) is a front view of the key input device 10, and FIG. 2(B) is a side view thereof. FIG. 3 is a partially enlarged view of the key input device 10. FIG. 4 is a block diagram showing a main configuration of the key input device 10.

As shown in FIG. 1, the key input device 10 includes a piezoelectric film 30, a diaphragm 40, a spacer 70, an extended wire 20, and an adhesive tape 25. As shown in FIG. 4, the key input device 10 includes, as a hardware configuration, a touch detection unit 80, a control unit 90 connected to the touch detection unit 80, a drive unit 81 connected to the control unit 90, and the piezoelectric film 30 connected to the drive unit 81. The key input device 10 is a so-called keyboard, being connected to a host device (an information processing device such as a personal computer), not shown, wirelessly or by wire, and is an interface for accepting user's key input.

The touch detection unit 80, not shown, is provided on the flat diaphragm 40. The touch detection unit 80 is provided in a position corresponding to each key arrangement, for example, and detects a touch operation by a user. Note that the touch detection unit 80 may be of any type as long as having a function to detect a touch operation by the user, and it is possible to use various methods such as a membrane type, a capacitance type, a piezoelectric film type, or some other type.

When the user touches the touch detection unit 80, the drive unit 81 applies a drive signal to the piezoelectric film 30. Thereby, the piezoelectric film 30 expands and contracts.

The piezoelectric film 30 is fixed to both ends in a lateral direction (Y direction) of the diaphragm 40 on the rear surface of the diaphragm 40. The diaphragm 40 is made of acrylic resin PMMA, for example. As the diaphragm 40, there may be used another material such as a metal plate, PET, polycarbonate (PC), fiber reinforced plastic (FRP), or glass. In the present embodiment, the piezoelectric film 30 is fixed to both ends in the Y direction, but the piezoelectric film 30 may be fixed to both ends in a longitudinal direction (X direction), for example.

As shown in FIG. 3, the piezoelectric film 30 includes a base film 200 having a rectangular shape in plan view and an electrode 201A and an electrode 201B formed on main surfaces of the base film 200 which face each other.

The base film 200 is piezoelectric resin, and formed of a material such as polyvinylidene fluoride (PVDF) or a chiral polymer, for example. The material used is more preferably PVDF, but poly lactic acid (PLA) with high translucency may be used. In the case of using PLA, using a material with high translucency also in the other constitution enables achievement of the key input device 10 having high translucency on almost the entire surface as viewed from the front. Making the base film and the electrodes transparent facilitates finding a defective product in a finished state. It also enables improvement in design property, such as lighting the keyboard from the inside.

PLA is not affected by the change in ambient temperature due to having no pyroelectricity, so that the intensity of vibration remains unchanged by the change in air temperature, the heat generation of the electronic device, the change in temperature caused by contact of the finger, and the like.

When the base film 200 is made of PLA, as shown in FIG. 2(A), PLA is cut so as to make each outer periphery form almost 45° with respect to a stretching direction, so that the base film 200 is formed in a rectangular shape and has piezoelectricity.

The electrodes 201A and 201B are formed on almost the entire surfaces of both main surfaces of the base film 200. The electrodes 201A and 201B are preferably composed mainly of indium tin oxide (ITO), zinc oxide (ZnO), and polythiophene. In addition, a material with high conductivity, such as an aluminum vapor deposition electrode or a copper foil electrode, can be used as an electrode to achieve power saving.

For the electrodes 201A and 201B, a silver nano-wire electrode can also be used, and an aluminum vapor deposition electrode is preferably used in a use mode where the translucency can be low. An extended wire 20 is connected to the electrodes 201A and 201B, and a drive signal is applied thereto. The electrode 201A disposed on the diaphragm 40 side is stuck to the diaphragm 40 via an adhesive layer 60.

As shown in FIGS. 1 and 2(B), the diaphragm 40 is fixed to the piezoelectric film 30 so as to be curved toward the opposite side (the front side of the diaphragm 40) to the side where the piezoelectric film 30 is present (the rear side of the diaphragm 40) and have a protruding shape. Note that the shape protruding to the front side is not an indispensable element in the present invention. The diaphragm 40 may be in a completely flat state so long as not protruding to the rear side in a state after the piezoelectric film 30 is connected. Even if the diaphragm 40 is curved toward the rear side in a state before the piezoelectric film 30 is connected, the diaphragm 40 can be formed into the shape protruding to the front side by using the spacer 70.

However, in the present embodiment, the curved state of the diaphragm 40 is exaggeratingly described for the sake of explanation, and in reality, the main surface of the diaphragm 40 and the main surface of the piezoelectric film 30 are close to parallel, and almost flat on the outer appearance.

As described above, the diaphragm 40 is fixed to the piezoelectric film 30 with the flat surface in a curved state, and hence the diaphragm 40 is fixed to the piezoelectric film 30 while bending stress is applied to the diaphragm 40, as shown by a hollow arrow F901 in FIG. 2(B). Further, as shown by a hollow arrow 5901 in FIG. 2(B), tensile force is applied in the lateral direction on the main surface of the piezoelectric film 30.

When the drive unit 81 applies a drive signal to the piezoelectric film 30 and the piezoelectric film 30 contracts along the Y direction, the diaphragm 40 is pulled in a direction from the section (the end in the lateral direction) fixed to the piezoelectric film 30 toward the center. The center portion of the diaphragm 40 in the Y direction is thereby curved so as to protrude more forward. Further, the end of the diaphragm 40 in the Y direction moves to the rear side. A section indicated by a one-dotted broken line in FIG. 2(A) is a section to be a node of vibration and corresponds to the first region of the present invention. In the first region, the diaphragm 40 hardly vibrates even when the piezoelectric film 30 expands and contracts, and hardly moves to the front side or the rear side.

On the other hand, when the drive unit 81 applies a drive signal of the opposite phase to the piezoelectric film 30 and the piezoelectric film expands along the Y direction, the diaphragm 40 is pulled in a direction from the center to the section (the end in the lateral direction) fixed toward the piezoelectric film 30. The center portion of the diaphragm 40 in the Y direction thereby comes into a curved state with a reduced amount of protrusion forward. Further, the end of the diaphragm 40 in the Y direction moves to the front side.

Therefore, the diaphragm 40 vibrates in a direction to the front and a direction to the rear (Z direction) in a section (second region) other than the first region in accordance with the amplitude of the drive signal. As a result, vibration in accordance with the drive signal is transmitted to the user via the diaphragm 40. Therefore, when the user touches the diaphragm 40 via the touch detection unit 80, the user can feel that the key has been "pressed" due to feedback of the vibration.

With steady bending stress being applied to the diaphragm 40 in a non-operating state, the force applied to the diaphragm 40 at the time of expansion of the piezoelectric film 30 is in the same direction as that of the bending stress. Hence the key input device 10 can efficiently vibrate the diaphragm 40, and can transmit vibration that is strong to some extent even in the case of using a piezoelectric film. As compared to the vibration by a motor or the like, the key input device 10 can be made thinner and more responsive than the motor, so that the feel of touch can be reproduced accurately.

As described above, in the diaphragm 40, there is a first region that does not vibrate in the vicinity of the one-dotted broken line shown in FIG. 2(A). In the present embodiment, the spacer 70 is disposed in the first region.

The spacer 70 has the function of supporting the diaphragm 40 and the function of generating tensile force by separating the piezoelectric film 30 from the diaphragm 40. By disposing the spacer 70 in the first region, the spacer 70 does not hinder the vibration of the diaphragm 40 and does not hinder the expansion and contraction of the piezoelectric film 30. However, the spacer 70 is not indispensable in the present invention.

The extended wire 20 is electrically connected to the electrode 201A or the electrode 201B with a grommet, a conductive tape, a thermally-weldable conductive sheet, conductive paste, or the like at the end in the Y direction. The end of the piezoelectric film 30 in the Y direction is connected to the diaphragm 40 and the end thereof in the Y direction is a section where the piezoelectric film 30 does not expand or contract. This lowers the possibility of contact failure in the connecting section between the extended wire 20 and the piezoelectric film 30 due to expansion and contraction of the piezoelectric film 30. Further, the electrode is not pulled by the extended wire 20, thereby lowering the possibility of peeling of the electrode or breakage of the piezoelectric film.

However, even at the end of the piezoelectric film 30 in the Y direction, the diaphragm 40 has a section (second region) where the diaphragm 40 vibrates, and which vibration may cause the contact failure in the connecting section between the extended wire 20 and the piezoelectric film 30. Therefore, the extended wire 20 is extended from the end of the piezoelectric film 30 in the Y direction toward the first region, and is extended from the position in the vicinity of the spacer 70 outside of the perimeter of the diaphragm. Therefore, the extended wire 20 is extended outside of the perimeter of the diaphragm from a portion where the vibration of the diaphragm 40 is less than that at the end in the Y direction.

In addition, the extended wire 20 is stuck and fixed to the diaphragm 40 by the adhesive tape 25 in the vicinity of the spacer 70. The extended wire 20 is in a slack state from a section connected with the piezoelectric film 30 to a section to be stuck with the adhesive tape 25. Therefore, the vibration of the diaphragm 40 is not transmitted outside of the perimeter of the diaphragm via the extended wire 20, and the extended wire 20 is not pulled.

Although the extended wire 20 is extended from the vicinity of the spacer 70 outside of the perimeter of the diaphragm in the embodiment, when there is no spacer 70, the extended wire 20 is preferably extended outside of the perimeter of the diaphragm from a position where the vibration is the smallest (the first region). Further, in this example, the extended wire 20 is stuck to the diaphragm 40 with the adhesive tape 25, but it may be fixed to the diaphragm 40 by soldering, for example. The diaphragm 40 may have a structure for fixing the extended wires 20. Further, the fixing section is not necessarily provided to the diaphragm 40, and may be provided to the spacer disposed in the first region.

In this example, the extended wire 20 is connected to the piezoelectric film 30 at the end in the Y direction, but it may be connected to the piezoelectric film 30 at another position. Even when the extended wire 20 is connected to the piezoelectric film 30 at another position, the extended wire 20 is extended toward the first region where the vibration is small, thus producing the effect of preventing the occurrence of connection failure or the like due to expansion and contraction of the film.

Figure 9:
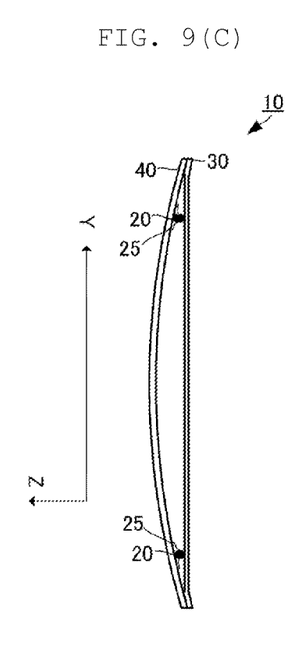
FIG. 9(A) is a front view of the key input device.
FIGS. 9(B) and 9(C) are side views thereof.

Further, for example, as shown in a plan view of FIG. 9(A) and sectional views of FIG. 9(B) and FIG. 9(C), the extended wire 20 may be connected to the piezoelectric film 30 in the first region, and may then be extended from the first region outside of the perimeter of the diaphragm. In this case, as shown in the sectional view of FIG. 9(C), the extended wire 20 is extended in a direction from the section connected with the piezoelectric film 30 to the front (Z direction), for example, and is stuck to the diaphragm 40 with the tape 25. The extended wire 20 is in a slack state from the section connected with the piezoelectric film 30 to the diaphragm 40. Therefore, the expansion and contraction of the piezoelectric film 30 is not hindered, the vibration of the diaphragm 40 is not transmitted outside of the perimeter of the diaphragm via the extended wire 20, or the extended wire 20 is not pulled.

Figure 5A:
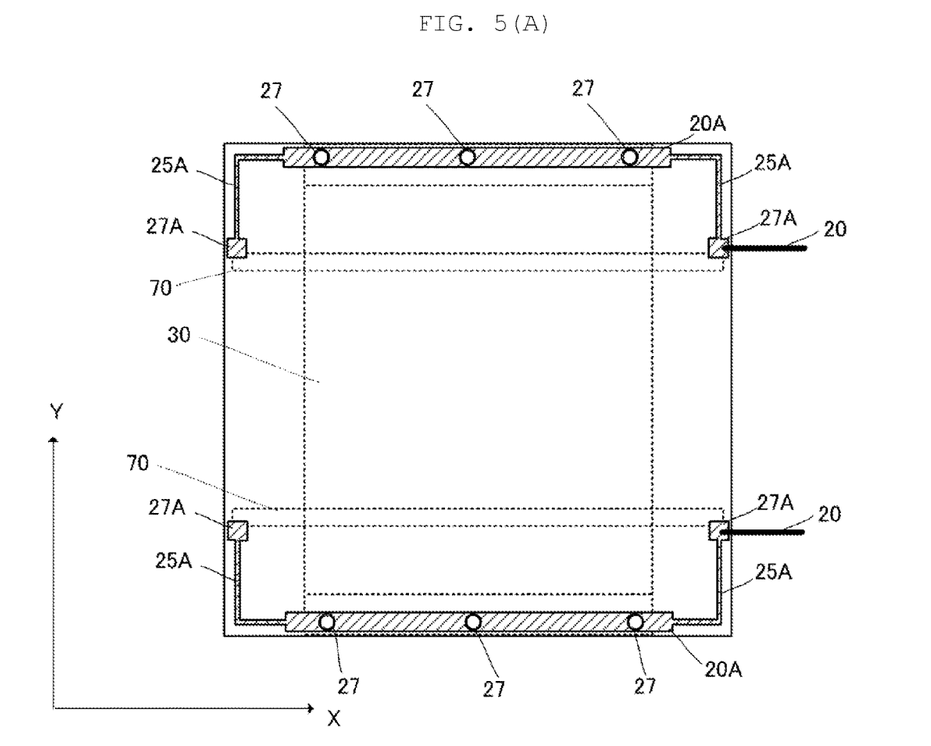
FIG. 5(A) is a plan view showing a modified example of extended wires.

Next, FIG. 5(A) is a plan view according to a modified example of the extended wire. In the above example, the extended wire 20 is in the form of a lead wire, and the extended wire in this example is made up of an electrode pattern formed on the front surface of the diaphragm 40. A rectangular electrode pattern 20A is provided along the X direction at the end in the Y direction in the front face of the diaphragm 40.

Figure 5B:
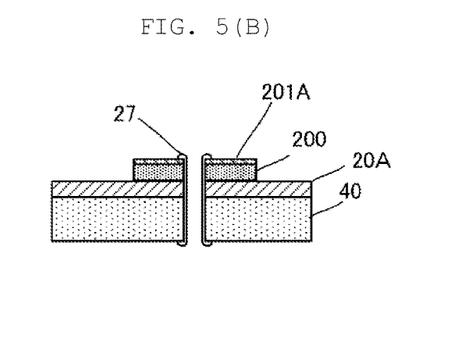
FIGS. 5(B) and 5(C) are sectional views thereof.
Figure 5C:
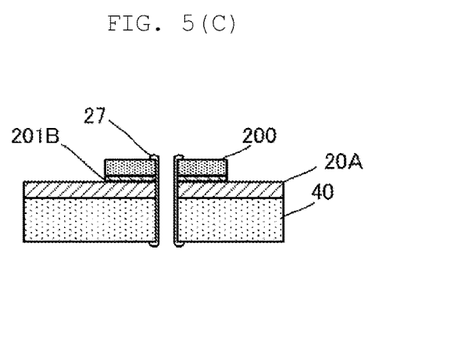

A hole is formed in the electrode pattern 20A and the diaphragm 40, and a grommet 27 is inserted into the hole. The grommet 27 is electrically connected to the electrode 201A or 201B of the piezoelectric film 30 on the rear side of the diaphragm 40. FIG. 5(B) is a sectional view in a case where the electrode pattern 20A and the electrode 201A are connected via the grommet 27. In this section, the electrode 201B is removed by etching or the like so as not to come into contact with the electrode pattern 20A. FIG. 5(C) is a sectional view in a case where the electrode pattern 20 and the electrode 201B are connected via the grommet 27. In this section, the electrode 201A is removed by etching or the like so as not to come into contact with the electrode pattern 20A.

The electrode pattern 20A is electrically connected to a portion (electrode connecting part 27A) that connects the extended wire 20 being the lead wire, via an electrode pattern 25A formed from the end in the Y direction toward the position where the spacer 70 is disposed (i.e., first region). The extended wire 20 is connected to the electrode connecting part 27A by soldering or the like and is extended outside of the perimeter of the diaphragm. The extended wire 20 may be connected on the front side of the diaphragm 40, but can be connected on the rear side by forming a through hole, a grommet, or the like in the electrode connecting part 27A. In this case, by thinly scraping the rear side of the diaphragm 40, it is also possible to prevent the projection of the extended wire 20, the grommet, or the like from protruding toward the rear side.

In addition, each electrode pattern may be formed on the rear surface of the diaphragm 40. Also in the case of forming the electrode pattern on the rear side, the extended wire 20 may be connected on the rear side of the diaphragm 40, but can be connected on the front side by forming a through hole, a grommet, or the like in the electrode connecting part 27A. By thinly scraping the front side of the diaphragm 40, it is also possible to prevent the projection of the extended wires 20, the grommet, or the like from protruding toward the front side.

In the example of FIGS. 5(A) to 5(C), the electrode connecting parts 27A are provided at both ends in the X direction, but only any one of the electrode connecting parts 27A may be provided.

In the vibration device shown in FIGS. 5(A) to 5(C), with the above-described configuration, there is no need for routing the lead wires. Further, the electrode connecting part 27A and the extended wire 20 are firmly connected by soldering or the like. Even when the extended wire 20 is temporarily detached, it can be repaired easily.

Figure 6A:
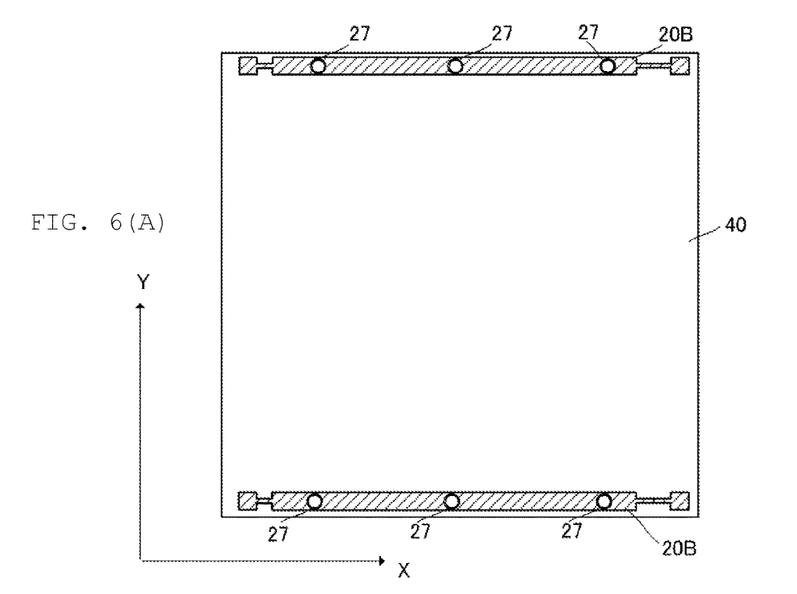
FIGS. 6(A) and 6(B) are diagrams showing a modified example of the extended wires.
Figure 6B:
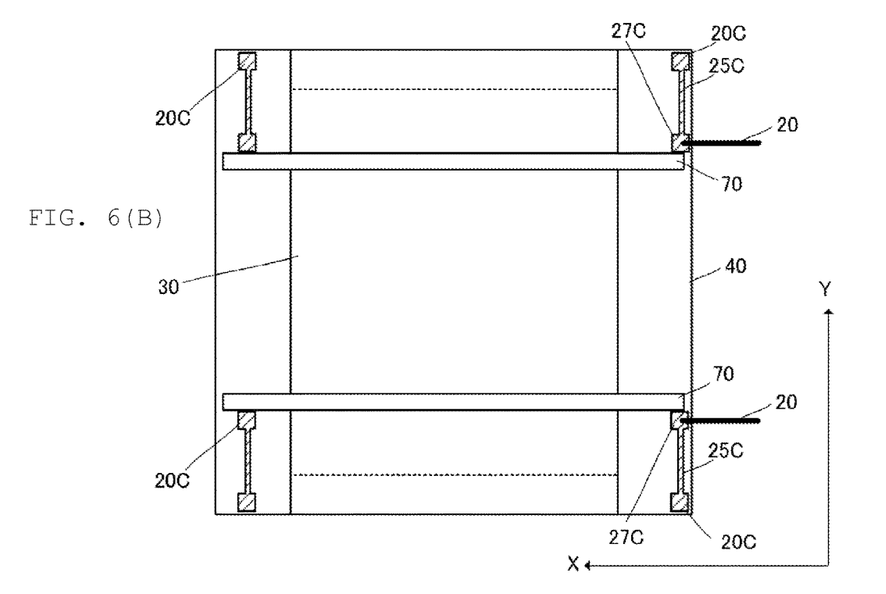

Next, FIG. 6(A) is a plan view according to a modified example of the extended wire (application example of FIGS. 5(A) to 5(C)), and FIG. 6(B) is a rear view thereof. In the example of FIGS. 5(A) to 5(C), the electrode patterns are all formed on the front side (or the rear side) of the diaphragm 40, but in this example, the electrode pattern 20B is formed on the front side of the end of the diaphragm 40 in the Y direction. However, the electrode pattern 20B is connected to an electrode pattern 20C on the rear side via a through hole or the like at the end in the X direction. Then, the electrode pattern 20B is electrically connected to a portion (electrode connecting part 27C) that connects the extended wire 20, via the electrode pattern 25C formed from the end in the Y direction toward the position where the spacer 70 is disposed (i.e., first region).

In this mode, the electrode pattern is formed only at the end in the Y direction on the front side, and the remaining electrode pattern is formed on the rear side. Therefore, the electrode pattern and the lead wire are eliminated except for the end of the diaphragm 40 in the Y direction, and the front surface of the diaphragm 40 can be kept flat.

Figure 7:
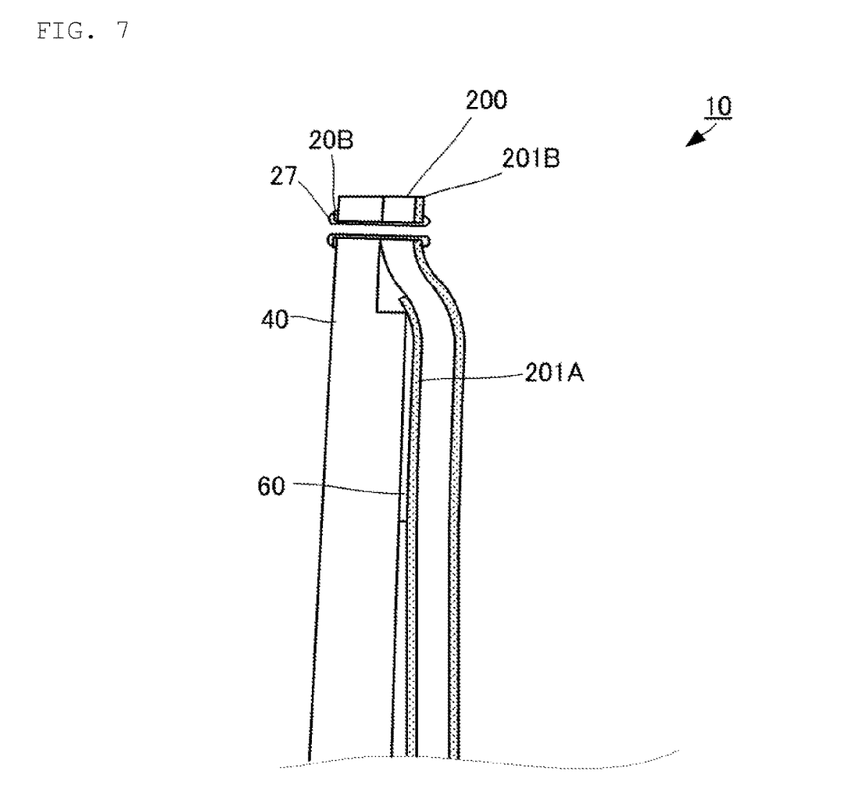
FIG. 7 is a partial enlarged side view of the key input device.

Further, as shown in FIG. 7, by thinly scraping the diaphragm 40 on the rear side of the electrode pattern 20B, it is possible to accommodate a section thickened by the grommet 27, and it is possible to reduce the thickness of the diaphragm 40. In FIG. 7, the grommet 27 and the electrode 201B are disposed to directly contact each other, but a separate conductive sheet may be interposed therebetween. Adding a conductive sheet enables reduction in load applied to the piezoelectric film and the electrode 201B at the time of attaching the grommet 27, vibrating, or the like. Even in the case of adding a conductive sheet, as shown in FIG. 7, the diaphragm 40 is thinly scraped to form grooves, so that the thickness of the diaphragm 40 does not increase significantly.

Figure 8:
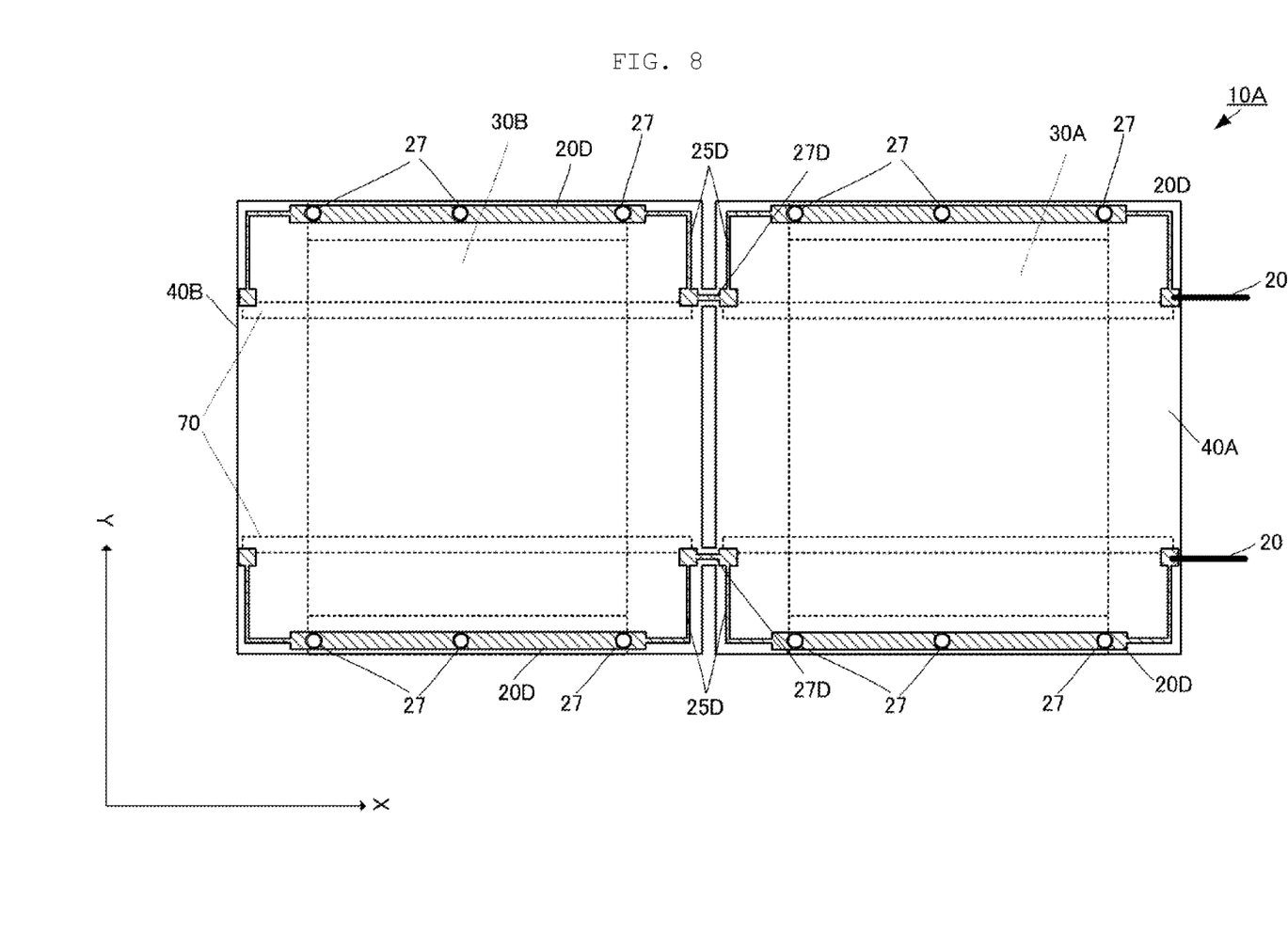
FIG. 8 is a front view of a key input device including a plurality of piezoelectric films.

Next, FIG. 8 is a front view of a key input device 10A including a plurality of piezoelectric films. In the key input device 10A, one diaphragm is divided into a first vibration part 40A and a second vibration part 40B. The first vibration part 40A and the second vibration part 40B are connected in the vicinity of the first region being a node of vibration. That is, in the central portion of the diaphragm in the X direction, the second region is scraped off, leaving the first region. As a result, the first vibration part 40A and the second vibration part 40B are connected in a section where there is little vibration, and there is no possibility that the connecting section is broken by vibration.

The key input device 10A includes two piezoelectric films 30A and 30B. The piezoelectric film 30A is connected at the end of the first vibration part 40A in the Y direction and the piezoelectric film 30B is connected at the end of the second vibration part 40B in the Y direction. The first vibration part 40A and the second vibration part 40B vibrate due to expansion and contraction of the piezoelectric film 30A and the piezoelectric film 30B, respectively.

In a case where the vibration part is not divided, when the tensile force of one piezoelectric film is strong, the tensile force of the other piezoelectric film becomes weak, so that expansion and contraction of the piezoelectric film on the side of weak tensile force is hardly transmitted to the diaphragm 40. However, as in the example shown in FIG. 8, when one diaphragm is divided into two vibration parts and the piezoelectric film is connected to each of them, the tensile force can be kept constant in each piezoelectric film, and the diaphragm can be appropriately vibrated by expansion and contraction of each piezoelectric film.

Similarly to the example shown in FIGS. 5(A) to 5(C), the key input device 10A has the electrode pattern 20D formed on the front surface of the diaphragm 40. However, the electrode pattern 20D connected to each of the piezoelectric film 30A and the piezoelectric film 30B is electrically connected via an electrode pattern 25D formed from the end in the Y direction toward a position (i.e. first region) where the spacer 70 is disposed, and an electrode pattern 27D provided in the vicinity of the spacer 70 and formed along the X direction. The electrode pattern 27D is disposed in the first region being a node of the diaphragm, and is disposed in a section connecting the first vibration part 40A and the second vibration part 40B.

Hence there is no possibility that the connecting section between the first vibration part 40A and the second vibration part 40B may be damaged due to vibration, and there is also no possibility that the extended wire for electrically connecting the two piezoelectric films may cause connection failure due to vibration.

Although the first vibration part 40A and the second vibration part 40B are connected in the first region in FIG. 8, the first vibration part 40A and the second vibration part 40B may be provided as separate diaphragms, and the portion of the electrode pattern 27D may be a lead wire. In this case, the first vibration part 40A and the second vibration part 40B can be folded so as to overlap each other. The diaphragm can be carried with a smaller area by being folded. The diaphragm has extremely a small thickness and is thus not inconvenient to carry even when folded.

Note that the piezoelectric film is an example of a film that is deformed in the planar direction by application of a voltage, and the other films that deform in the planar direction by application of a voltage include electrostrictive films, electret films, composite films, and electroactive polymer films.

Further, "a film that is deformed in the planar direction by application of a voltage" can also be achieved by using piezoelectric ceramics and resin film, for example. For example, it can be achieved by connecting a plurality of resin films via piezoelectric ceramics and connecting the respective resin films to the diaphragm 40.

Moreover, "a film that is deformed in the planar direction by application of a voltage" may be a single layer or may be laminated. Especially stronger vibrations can be obtained by increasing the number of laminated sheets.

In the above example, the tactile presentation device is shown as an example of the vibration device, but the vibration device of the present invention is not necessarily limited to "tactile", and for example, a device that outputs sound such as a speaker is an example of the vibration device.

Figure 10A:
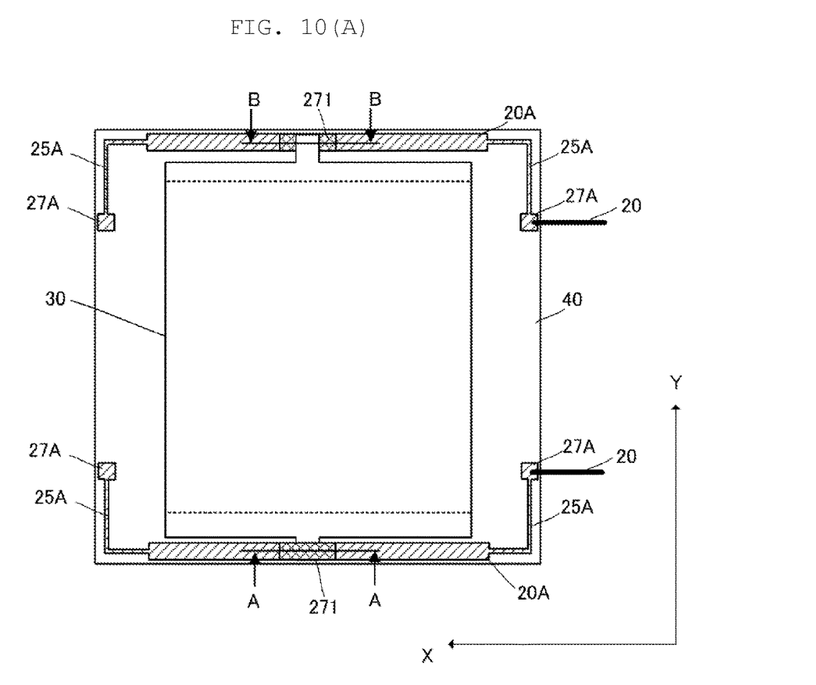
FIG. 10(A) is a plan view (a rear view of a diaphragm 40) in the case of using a thermally-weldable conductive sheet for connecting the diaphragm 40 and a piezoelectric film 30.
Figure 10B:
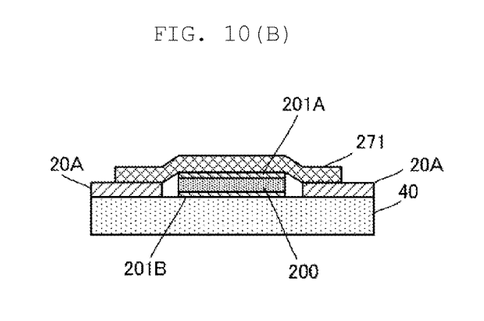
FIG. 10(B) is a sectional view taken along a line A-A in FIG. 10(A)
Figure 10C:
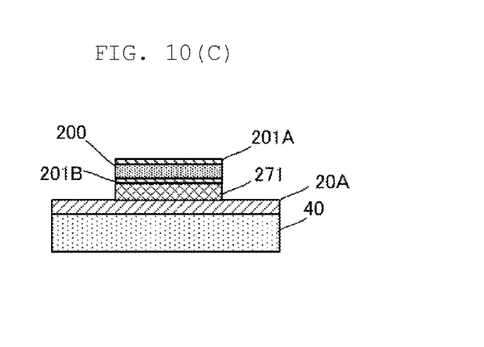
FIG. 10(C) is a sectional view taken along a line B-B in FIG. 10(A).

FIG. 10(A) is a plan view (rear view of the diaphragm 40) in a case where a thermally-weldable conductive sheet is used for connecting the diaphragm 40 and the piezoelectric film 30. FIG. 10(B) is a sectional view taken along a line A-A shown in FIG. 10(A), and FIG. 10(C) is a sectional view taken along a line B-B shown in FIG. 10(A).

In this example, only a portion of the end of the piezoelectric film 30 in the Y direction is extended and connected to the electrode pattern 20A (however, that only a portion of the piezoelectric film 30 is extended is not an indispensable configuration of the present invention).

The piezoelectric film 30 is stuck to a thermally-weldable conductive sheet 271 and is electrically connected to the electrode pattern 20A via the thermally-weldable conductive sheet 71. As shown in FIG. 10(B), the electrode pattern 20A is not formed in the section of the piezoelectric film 30 to which the electrode 201A is connected, and hence the electrode 201A and the electrode pattern 20A do not come into contact. However, it is preferable to dispose an insulating material in a gap between the electrode pattern 20A and the piezoelectric film 30 because the thermally-weldable conductive sheet 271 may enter the gap. Meanwhile, as shown in FIG. 10(C), in the section of the piezoelectric film 30 to which the electrode 201B is connected, the first main surface of the thermally-weldable conductive sheet 271 is stuck to the electrode pattern 20A, and the electrode 201B of the piezoelectric film 30 is stuck to the second main surface of the thermally-weldable conductive sheet 271. In the case of FIG. 10(C), it is not necessary to dispose an insulator or the like because the electrode 201A and the electrode pattern 20A are unlikely to come into contact.

By connecting the piezoelectric film 30 and the electrode pattern 20A via the thermally-weldable conductive sheet as thus described, the thickness is reduced as compared with the grommet 27. Further, electrolytic corrosion does not occur because there is no dissimilar metal. Moreover, etching of the electrodes as shown in FIGS. 5(B) and 5(C) is unnecessary. The conductive sheet is easily made to adhere, and in the case of a thermally-weldable conductive sheet, it is hardly affected by ambient temperature. Meanwhile, the grommet can be fixed more firmly than the thermally-weldable conductive sheet and the fixed state can be visually recognized.

DESCRIPTION OF REFERENCE SYMBOLS 10, 10A: key input device
20: extended wire
20A, 20B, 20C, 20D: electrode pattern
25: adhesive tape
25A, 25C, 25D: electrode pattern
27: grommet
27A, 27C: electrode connecting part
27D: electrode pattern
30, 30A, 30B: piezoelectric film
40: diaphragm
40A: first vibration part
40B: second vibration part
60: adhesive layer
70: spacer
80: touch detection unit
81: drive unit
90: control unit
200: base film
201A, 201B: electrode

The invention claimed is:

1. A vibration device, comprising:
a diaphragm having a perimeter;
a film coupled to the diaphragm, the film having first and second opposed main surfaces, and constructed to expand and contract with application of a voltage;
a first electrode on the first main surface of the film;
a second electrode on the second main surface of the film;
a first wire extending from the first electrode outside of the perimeter of the diaphragm; and
a second wire extending from the second electrode outside of the perimeter of the diaphragm,
wherein
the diaphragm has at least one first region located in a node of vibration of the film and a second region located in a position other than the node of vibration of the film,
the first wire has a first section extending from the second region toward the at least one first region, and
the second wire has a second section extending from the second region toward the at least one first region.

2. The vibration device according to claim 1, wherein the film includes a plurality of films, and
a connecting wire that connects the first and second electrodes of the respective films, the connecting wire having a third section extending from the second region toward the at least one first region.

3. The vibration device according to claim 1, wherein the first wire includes a first electrode pattern on the diaphragm and a first wire portion, and the second wire includes a second electrode pattern on the diaphragm and a second wire portion.

4. The vibration device according to claim 1, wherein the first electrode and the first wire are connected in a first section closer to a first end side of the film than a first connecting section between the film and the diaphragm, and the second electrode and the second wire are connected in a second section closer to a second end side of the film than a second connecting section between the film and the diaphragm.

5. The vibration device according to claim 1, wherein
the diaphragm includes a first vibration part and a second vibration part,
the first wire is disposed in a first portion where the first vibration part and the second vibration part are coupled, and
the second wire is disposed in a second portion where the first vibration part and the second vibration part are coupled.

6. The vibration device according to claim 1, wherein the film is a piezoelectric film.

7. The vibration device according to claim 1, further comprising at least one spacer disposed in the at least one first region and between the diaphragm and the film.

8. The vibration device according to claim 7, wherein at least one of the first wire and the second wired extends from a position adjacent the at least one spacer to the outside of the perimeter of the diaphragm.

9. A tactile presentation device, comprising:
the vibration device according to claim 1;
a touch detection unit that detects a touch operation; and
a drive unit that applies a drive signal to the film when the touch detection unit detects the touch operation.

10. A vibration device, comprising:
a diaphragm having a perimeter;
a film coupled to the diaphragm, the film having first and second opposed main surfaces, and constructed to expand and contract with application of a voltage;
an electrode on at least one of the first and second main surfaces of the film; and
a wire extending from the electrode outside of the perimeter of the diaphragm, wherein
the diaphragm has a first region located in a node of vibration and a second region located in a position other than the node of vibration, and
the wire is extended from the first region outside of the perimeter of the diaphragm.

11. The vibration device according to claim 10, wherein the film includes a plurality of films, and
a connecting wire that connects the first and second electrodes of the respective films.

12. The vibration device according to claim 10, wherein the wire includes an electrode pattern on the diaphragm.

13. The vibration device according to claim 10, wherein the electrode and the wire are connected in a first section closer to an end side of the film than a connecting section between the film and the diaphragm.

14. The vibration device according to claim 10, wherein the diaphragm includes a first vibration part and a second vibration part,
the wire is disposed in a portion thereof where the first vibration part and the second vibration part are coupled.

15. The vibration device according to claim 10, wherein the film is a piezoelectric film.

16. The vibration device according to claim 10, further comprising a spacer disposed in the first region and between the diaphragm and the film.

17. The vibration device according to claim 16, wherein the wire extends from a position adjacent the spacer to the outside of the perimeter of the diaphragm.

18. A tactile presentation device, comprising:
the vibration device according to claim 10;
a touch detection unit that detects a touch operation; and
a drive unit that applies a drive signal to the film when the touch detection unit detects the touch operation.

* * * * *